(12) United States Patent
Avnery

(10) Patent No.: US 6,919,570 B2
(45) Date of Patent: Jul. 19, 2005

(54) ELECTRON BEAM SENSOR

(75) Inventor: Tzvi Avnery, Winchester, MA (US)

(73) Assignee: Advanced Electron Beams, Inc., Wilmington, MA (US)

( * ) Notice: Subject to any disclaimer, the term of this patent is extended or adjusted under 35 U.S.C. 154(b) by 0 days.

(21) Appl. No.: 10/326,923

(22) Filed: Dec. 19, 2002

(65) Prior Publication Data

US 2004/0119024 A1 Jun. 24, 2004

(51) Int. Cl.$^7$ .............................................. H01J 33/04
(52) U.S. Cl. .................. 250/397; 250/492.3; 156/272.2
(58) Field of Search ............................. 250/397, 492.3, 250/455.11, 400; 156/272.2, 275.5

(56) References Cited

U.S. PATENT DOCUMENTS

| | | | |
|---|---|---|---|
| 2,814,730 A | | 11/1957 | Fechter |
| 4,517,462 A | | 5/1985 | Boyer et al. |
| 4,652,763 A | | 3/1987 | Nablo |
| 4,992,742 A | | 2/1991 | Okuda et al. |
| 5,227,700 A | * | 7/1993 | Nagai et al. ................ 315/383 |
| 5,714,875 A | * | 2/1998 | Lawrence et al. .......... 324/71.3 |
| 6,110,318 A | * | 8/2000 | Goodman ................ 156/272.2 |
| 6,407,492 B1 | | 6/2002 | Avnery et al. |

FOREIGN PATENT DOCUMENTS

| | | |
|---|---|---|
| DE | 195 02 439 A1 | 8/1995 |
| EP | 1 104 002 A1 | 5/2001 |

OTHER PUBLICATIONS

Lubicki, P., et al., "Boron Nitride Electron Permeable Windows Used in Electron Beam Water Treatment," Electrical Insulation and Dielectric Phenomena, 1998, Annual Report, Conference on Atlanta, GA, USA, 25–58, Oct. 1998, New York, NY, USA, IEEE, US.

Seamans, J.F., and W.D. Kimura, "Design and Characterization of a Versatile Faraday Cup," *Rev. of Sci. Instrum.*, 64 (2), 460–469, American Institute of Physics, New York, U.S. (1993).

* cited by examiner

*Primary Examiner*—John R. Lee
*Assistant Examiner*—Zia R. Hashmi
(74) *Attorney, Agent, or Firm*—Hamilton, Brook, Smith & Reynolds, P.C.

(57) ABSTRACT

A sensing device for sensing an electron beam includes a vacuum chamber having an electron permeable window for allowing electrons from the electron beam to enter vacuum chamber. An electrode extends within the vacuum chamber for receiving at least a portion of the electrons entering the vacuum chamber. The intensity of the electron beam is capable of being determined from the amount of electrons received by the electrode.

45 Claims, 8 Drawing Sheets

ELECTRON BEAM SENSOR

BACKGROUND

When employing an electron beam emitter to irradiate objects, materials, substances, etc. with electron beams within gaseous atmospheres such as air, or behind an object, it is sometimes desirable to determine the intensity of the electron beam which actually reaches the subject of irradiation. Current methods of measuring include placing a calibrated sheet or film of electron sensitive material (dosemeter) in the path of the electron beam and then removing the sheet for visual inspection and measurement. Such a method is cumbersome and is not suitable for continuous monitoring of the electron beam in real time, or for use while processing material during manufacturing.

SUMMARY

The present invention provides a sensor or sensing device which can sense the intensity of an electron beam that has traveled from the electron beam emitter through a gaseous atmosphere such as air, or behind an object, to a location spaced apart from the electron beam emitter. In addition, the design of the sensing device allows continuous monitoring of the electron beam.

The sensing device for sensing the electron beam includes a vacuum chamber having an electron permeable window for allowing electrons from the electron beam to enter vacuum chamber. An electrode extends within the vacuum chamber for receiving at least a portion of the electrons entering the vacuum chamber. The intensity of the electron beam is capable of being determined from the amount of electrons received by the electrode.

In preferred embodiments, the electrode extends along an axis within the vacuum chamber with the electron permeable window being parallel to the axis of the electrode. The electrode extends from the vacuum chamber through an insulator for electrical connection to a cable. A measuring device is electrically connected to the electrode by the cable for measuring effects of the electron beam on the electrode. Typically, the measuring device measures at least one of voltage and current.

The present invention also provides a sensing device for sensing an electron beam accelerated by a voltage potential including a first sensing member for receiving electrons from the electron beam. A second sensing member receives electrons from the electron beam and is arranged for receiving less electrons than the first sensing member. A measuring device is electrically connected to the first and second sensing members for measuring effects of the electron beam on the first and second sensing members. The measuring device is capable of correlating the measured effects of the first and second sensing members into at least one of electron beam intensity and the voltage potential at which the electrons are accelerated.

In preferred embodiments, the sensing members each include a vacuum chamber having an electron permeable window for allowing electrons from the electron beam to enter the vacuum chamber. An electrode extends within the vacuum chamber for receiving at least a portion of the electrons entering the vacuum chamber. The intensity of the electron beam is capable of being determined from the amount of electrons received by the electrode of at least one of the sensing members. The measuring device is electrically connected to each electrode of the sensing members with a respective cable and measures at least one of voltage and current from the first and second sensing members. The voltage potential at which the electrons are accelerated can be determined from a ratio between the measured effects of the first and second sensing members. The ratio is matched with a matching stored data ratio originating from a library of stored data. The matching stored data ratio has an assigned voltage value corresponding to the voltage potential at which the electrons are accelerated.

In one embodiment, the sensing device further includes third and fourth sensing members for receiving electrons from the electron beam. The fourth sensing member is arranged for receiving less electrons than the third sensing member. The measuring device is electrically connected to the third and fourth sensing members for measuring effects of the electron beam on the third and fourth sensing members and correlating the measured effects of the third and fourth sensing members into at least one of electron beam intensity and the voltage potential at which the electrons are accelerated. In another embodiment, the sensing device includes an array of sensing members. The intensity of the electron beam at a particular location is capable of being determined from the amount of electrons received by the electrode of the sensing member at the particular location.

The present invention also provides a method of sensing an electron beam including positioning a vacuum chamber of a sensing device within the electron beam. The vacuum chamber has an electron permeable window for allowing electrons from the electron beam to enter the vacuum chamber. At least a portion of the electrons entering the vacuum chamber are received by an electrode extending within the vacuum chamber. The intensity of the electron beam is determined from the amount of electrons received by the electrode.

The present invention further provides a method of sensing an electron beam accelerated by voltage potential. A first sensing member is positioned within the electron beam for receiving electrons from the electron beam. A second sensing member is positioned within the electron beam for receiving electrons from the electron beam, and is arranged for receiving less electrons than the first sensing member. The effects of the electron beam on the first and second sensing members are measured with a measuring device electrically connected to the first and second sensing members. The measuring device correlates the measured effects of the first and second sensing members into at least one of electron beam intensity and the voltage potential at which electrons are accelerated, in regions occupied by the first and second sensing members.

The present invention additionally provides a sensing device for sensing an electron beam including an electrode for receiving electrons from the electron beam. The intensity of the electron beam is capable of being determined from the amount of electrons received by the electrode. An insulating layer covers the electrode for insulating the electrode from secondary electrical effects while at the same time allowing electrons from the electron beam to pass therethrough to the electrode.

The present invention also provides a method of sensing an electron beam including positioning an electrode within the electron beam for receiving electrons from the electron beam. The electrode is isolated from secondary electrical effects with an insulating layer covering the electrode which at the same time allows electrons from the electron beam to pass therethrough to the electrode. The intensity of the electron beam is determined from the amount of electrons received by the electrode.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
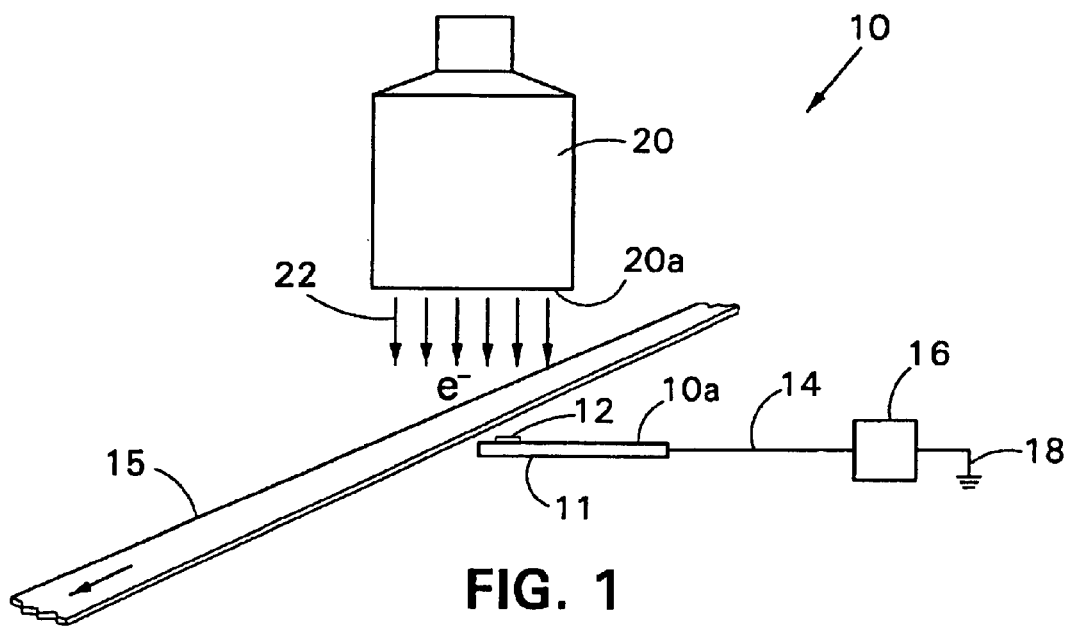
FIG. 1 is a schematic drawing of an embodiment of the present invention sensing device having a sensing tip positioned relative to an electron beam emitter for sensing the intensity of the electron beam at a location below the exit window of the electron beam emitter.

Referring to FIG. 1, sensing device 10 includes a sensing member or tip 11 for positioning in the path of a beam 22 of electrons $e^-$ exiting the electron beam exit window 20a of an electron beam emitter 20 for receiving electrons $e^-$ from electron beam 22. The beam of 22 electrons $e^-$ is typically formed by generating free electrons $e^-$ with a filament positioned in a vaccum chamber of the electron beam emitter 20 by passing a voltage therethrough, and accelerating the electrons $e^-$ out the exit beam window 20a with a high voltage potential. Sensing device 10 also includes a measuring device 16 connected to sensing tip 11 by a cable 14 for providing an indication of the intensity of electron beam 22 by measuring electrical effects or signals S (FIG. 3A) caused by the electrons $e^-$ received by the sensing tip 11. Measuring device 16 is electrically connected to ground 18. Typically, electron beam emitter 20 is employed for example, for irradiating objects, materials, substances, particles, liquids, coatings, gases, etc. with electron beam 22 for purposes such as curing, initiating chemical reactions, sterilizing, destroying molecules, transforming molecules, etc. FIG. 1 depicts a moving article 15, such as a web or extrusion, being irradiated by electron beam emitter 20 as an example. The sensing tip 11 of sensing device 10 is positioned at about the same distance away from the exit window 20a as the article 15 in order to be positioned within the electron beam 22 at a location where the intensity is about equal to the intensity of electron beam 22 reaching article 15. In situations where the electron beam 22 passes through an article 15 for irradiating a product behind the article 15, the sensing tip 11 would also be positioned behind the article 15.

Figure 2:
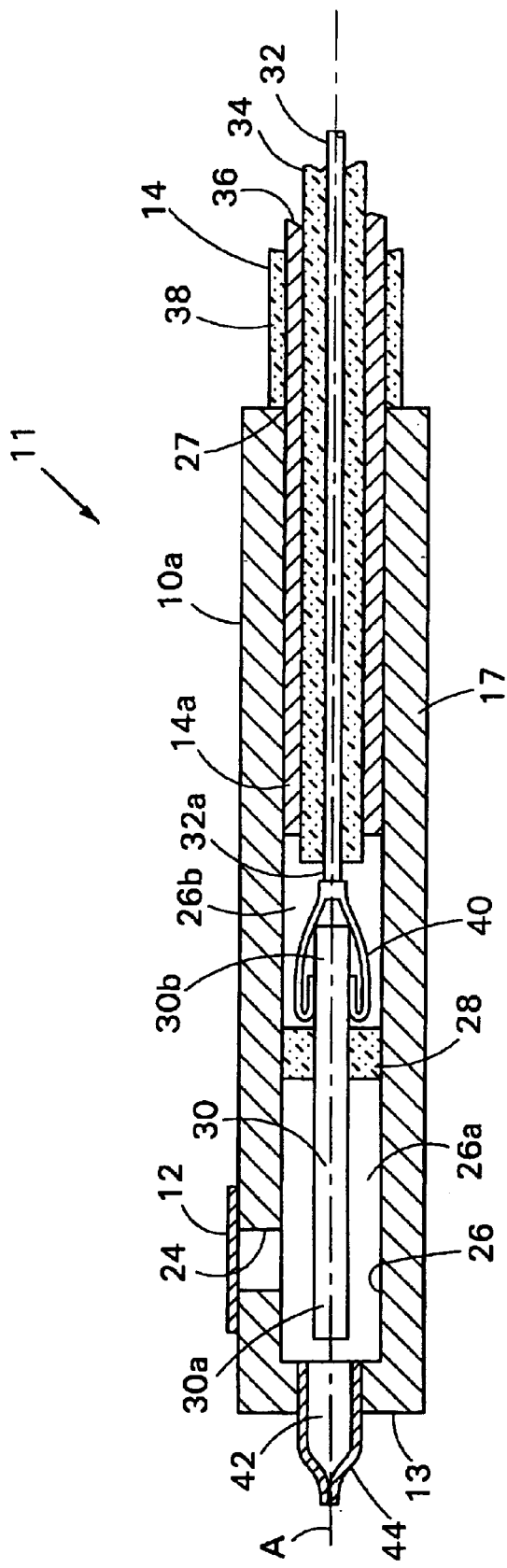
FIG. 2 is a side-sectional view of the sensing tip of the sensing device depicted in FIG. 1.

Referring to FIG. 2, an embodiment of sensing tip 11 includes an elongate sensing device body 10a having an end wall 13 at the distal end and an elongate cavity 26 having an opening 27 formed in the sensing device body 10a. The distal portion 26a of the cavity 26 forms a vacuum chamber which is separated in a gas tight manner from the proximal portion 26b of the cavity 26 by an insulator 28. The proximal portion 26b of cavity 26 can be exposed to the atmosphere. An electrode 30 extends from the proximal portion 26b of the cavity 26 through insulator 28 into the vacuum chamber 26a in a gas tight or sealed manner. An electron permeable entrance window 12 is sealed in a gas tight manner over an opening 24 that extends through the side wall of sensing device body 10a and into vacuum chamber 26a. A tube 44 extending through end wall 13 from opening 42 allows vacuum chamber 26a to be evacuated. The tube 44 is then sealed as shown to preserve a permanent hermetically sealed vacuum within vacuum chamber 26a. Tube 44 can be joined with sensing body 10a or can be formed integral therewith. The distal portion 30a of electrode 30 which extends into vacuum chamber 26a adjacent to entrance window 12 forms an electron receiving portion of the electrode 30 and the proximal portion 30b of electrode 30 which extends into the proximal portion 26b of cavity 26 allows the electrode 30 to be electrically connected to measuring device 16 (FIG. 1) via cable 14.

Cable 14 is typically a coaxial cable including a central conductor 32, an inner insulation layer 34 surrounding central conductor 32, an outer shield 36 surrounding the inner insulation layer 34, and an outer insulation layer 38 surrounding the outer shield 36. The outer insulation layer 38 is removed at the distal end 14a of cable 14 allowing insertion of the distal end 14a of cable 14 into the proximal portion 26b of cavity 26 through opening 27. A resilient electrical connector 40 is electrically connected or secured to the distal end 32a of central conductor 32 and resiliently engages the outer surfaces of the proximal or connector portion 30b of electrode 30 for electrical connection thereto. The wall 17 of sensing device body 10a which surrounds the proximal portion 26b of cavity 26 provides shielding of the connector portion 30b of electrode 30, the connector 40 and the distal end 14a of cable 14 from electrons $e^-$ that do not enter vacuum chamber 26a. The wall 17 is typically long enough to extend beyond the electron beam 22 so that cable 14 is not substantially electrically affected by electrons $e^-$ in the vicinity that do not enter the vacuum chamber 26a, but can still be effective when 2 to 3 inches long if within the beam, for example, at 100 kV.

In one embodiment, the sensing device body 10a of sensing tip 11 is formed of metal such as copper having a square cross section 0.25 by 0.25 inches and a length about 4 inches. At least about 2 inches of sensing device body 10a surrounds the proximal portion 26b of cavity 26 for extending out of the path of electron beam 22 to shield the connector portion 30b of electrode 30, connector 40 and cable 14 from electron beam 22. Cavity 26 is typically a round hole drilled into sensing device body 10a. Alternatively, cavity 26 can have other suitable shapes, such as square, rectangular, oval, etc. The opening 24 into vacuum chamber 26a typically ranges about 0.050 inches in diameter. Entrance window 12 is commonly a thin metallic foil membrane that is joined in metal to metal contact to sensing device body 10a by brazing, welding, or bonding of the foil membrane to cover the opening 24 in a sealed, gas tight manner. Entrance window 12 is typically formed of titanium ranging from about 2.5–8 microns thick with 6 microns being common for 80 kV and up. Entrance window 12 can also be formed of other metals such as beryllium, aluminum, stainless steel, etc. In addition, entrance window 12 can be formed of non-metallic materials such as silicon, silicon carbide, ceramics, diamond, etc., or more than one material, such as a layer of diamond on a titanium foil. Furthermore, entrance window 12 can be sealed over opening 24 by other conventional methods.

Electrode 30 is formed of metals such as nickel and is typically cylindrical, ranging about 0.030 inches in diameter, and extends into vacuum chamber 26a about 0.25 inches. Electrode 30 is positioned under or adjacent to opening 24 about 0.040 inches transverse or perpendicular to the axis of opening 24 and is aligned with opening 24 for receiving electrons $e^-$ passing through entrance window 12 and opening 24. The connector portion 30b of electrode 30 extends about 0.25 inches beyond insulator 28 for connecting to connector 40 of cable 14. Typically, insulator 28 is ceramic. Electrode 30 and cable 14 are aligned with each other along the longitudinal axis A of sensing device body 10a and cavity 26. In such an alignment, entrance window 12 extends generally parallel to the axis of the electrode 30. Alternatively, electrode 30 does not have to lie along axis A. Although electrode 30 has been shown to terminate within the proximal portion 26b of cavity 26 just beyond insulator 28, alternatively electrode 30 can extend the length of proximal portion 26b for connection with cable 14 at the proximal end of sensing device body 10a. Furthermore, the electrical connection between electrode 30 and cable 14 can be any suitable male/female connector configuration, or in some designs, can be crimped or soldered. Some configurations of sensing tip 11 may require a sensing device body 10a that is formed of two or more pieces that are assembled together.

In use, as seen in FIG. 1, the sensing tip 11 of the sensing device 10 is positioned within electron beam 22 under or adjacent, and spaced apart from the exit window 20a of electron beam emitter 20 with the electron permeable entrance window 12 facing exit window 20a and electron beam 22. The sensing tip 11 can be permanently fixed in position or be movably positionable into and out of the path of the electron beam 22. Electrons $e^-$ from the electron beam 22 traveling in a direction aligned with entrance window 12 are able to pass through the entrance window 12 and enter vacuum chamber 26a via opening 24. Most of the electrons $e^-$ entering the vacuum chamber 26a are at high energy and strike the electron receiving portion 30a of electrode 30. Since the electrode 30 is connected to ground 18 via cable 14 and measuring device 16, the electrons $e^-$ travel toward ground 18 producing current.

Measuring device 16 typically includes components for measuring either voltage or current signals S traveling from electrode 30. The measuring device 16 can include a resistor, for example, a shunt resistor, that is connected to ground, across which voltage is measured. Measuring device 16 can also include an ampmeter electrically connected between electrode 30 and ground for measuring current. The voltage or current signal levels S measured by measuring device 16 provide an indication of the electron beam intensities for electron beam 22. As the intensity of the electron beam 22 changes for a given high voltage potential, so does the measured voltage or current signal S. The intensity of electron beam 22 is typically related to the electron $e^-$ density of electron beam 22. More electrons $e^-$ will strike the electron receiving portion 30a of electrode 30 if the electron beam 22 has a higher density of electrons $e^-$. The higher the density of the electrons $e^-$, the higher the electron beam 22 intensity and the measured signal S. Consequently, the amount of electrons $e^-$ striking the electron receiving portion 30a of electrode 30 can determine the measured voltage or current signal S. Changing the high voltage potential can also change the level of signal S.

Figure 3A:
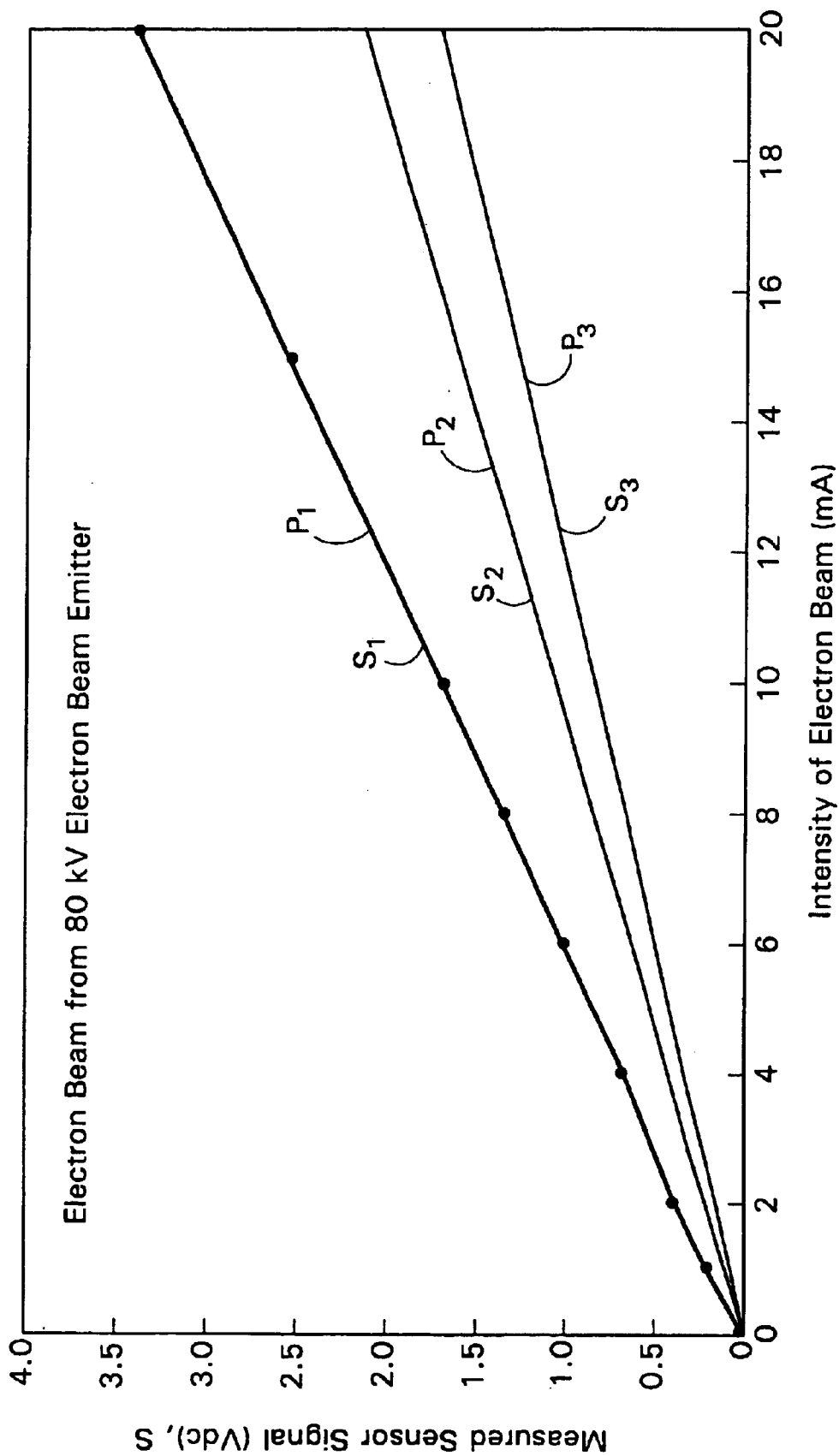
FIG. 3A is a graph depicting an example of the relationship between electron beam intensity and measured voltage signal levels in one embodiment of the present invention sensing device.
Figure 3B:
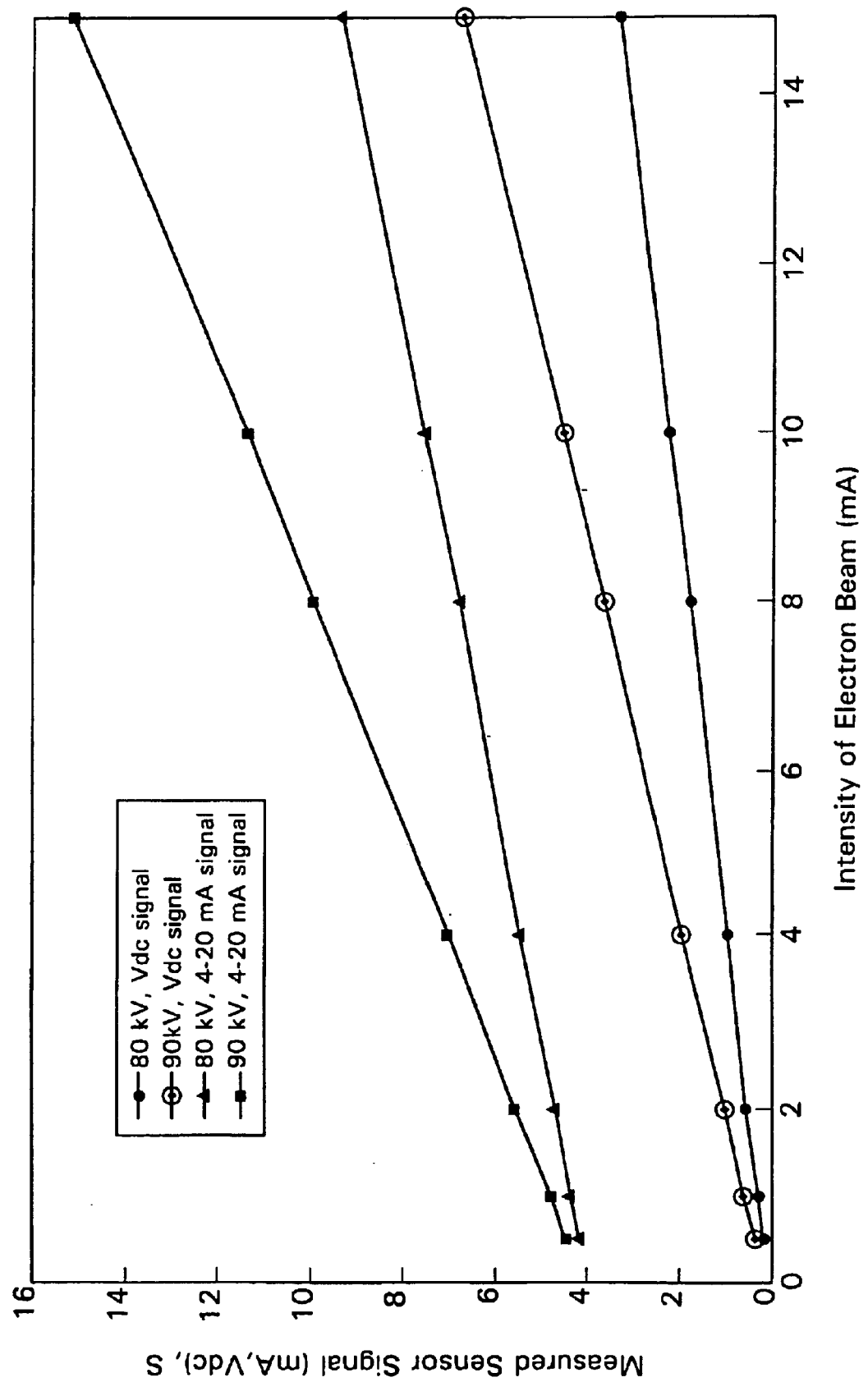
FIG. 3B is a graph depicting an example of the relationship between electron beam intensity and both measured voltage and current signal levels for operating high voltage potentials of 80 kV and 90 kV.

Generally, there is a linear relationship between the intensity of electron beam 22 and the measured voltage or current signal S levels. FIG. 3A depicts a graph showing an example of the linear relationship between electron beam intensity and measured voltage signal levels $S_1$, $S_2$ and $S_3$ in one embodiment for different positions or orientations $P_1$, $P_2$, and $P_3$ (for example, FIG. 5) of sensing tip 11 where the electron beam emitter 20 is accelerating electrons $e^-$ with an operating high voltage potential of 80 kV, and the measuring device 16 measures voltage signals from 0–10 VDC. Due to this linear relationship, previously determining the electrical signal S levels for a few known electron beam intensities 22 for a given electron beam emitter 20 and sensing tip 11 position allows an electrical signal level versus electron beam intensity linear curve to be formed for that condition. As a result, from such a curve, any electron beam intensity can be determined by the signal level S measured by sensing device 10. Even if the relationship in some cases is not linear, a signal level versus electron beam intensity curve can be formed by measuring enough signal levels S for known electron beam 22 intensities. Measuring device 16 can include circuitry for correlating the measured electrical signal levels directly into electron beam 22 intensities by using an equation defining the slope of the signal level versus electron beam intensity curve. The electron beam 22 intensities then can be displayed on a screen and/or employed for controlling the operation of electron beam emitter 20, or other manufacturing equipment. If required, the signals S to be measured can be amplified. Circuitry can also be employed to provide calibration functions. Alternatively, the electrical signal levels S can be measured and then be manually converted into electron beam 22 intensities, for example, by comparison on a graph such as in FIG. 3A or a chart. The measuring device 16 can include the components for measuring both voltage or current signals S within the device 16 with the selection between one or the other being made by selector switches or jumpers. FIG. 3B depicts a graph showing an example of the relationship between electron beam intensity and both measured voltage and current signals S, for operating high voltage potentials of either 80 kV or 90 kV.

As can be seen in FIG. 3A, different positions and/or orientations $P_1$, $P_2$ and $P_3$ (FIG. 5) of the sensing tip 11 relative to the exit window 20a of electron beam emitter 20 and electron beam 22 can result in different slopes for each measured electrical signal level/electron beam intensity curve. For example, if the sensing tip 11 at position $P_1$ has the entrance window 12 facing the exit window 20a of electron beam emitter 20, the sensing tip 11 at position $P_3$ can be farther away from exit window 20a than position $P_1$, and the sensing tip 11 at position $P_2$ can be oriented so that the entrance window 12 is at an angle relative to the exit window 20a. Both positions $P_2$ and $P_3$ result in signal levels $S_2$ and $S_3$ measured by measuring device 16 for a given electron beam 22 intensity that are lower than the signal level $S_1$ for position $P_1$, as well as curves with smaller or shallower linear slopes. The reason for this is that less electrons $e^-$ are able to enter an entrance window 12 that is farther away or does not directly face the electron beam 22. A sensing tip 11 that is positioned closer to an entrance window 12 or more directly faces the exit window 20a of electron beam emitter 20 such as in position $P_1$, will result in a higher signal level $S_1$ measured by measuring device 16 for each given electron beam 22 intensity and have a curve with a steeper linear slope. In addition, increasing the operating high voltage potential of electron beam emitter 20 above 80 kV will result in a higher signal level measured by measuring device 16 for each position $P_1$, $P_2$ and $P_3$, resulting in steeper linear slopes, while decreasing the operating high voltage potential below 80 kV will result in a lower measured signal and smaller or shallower linear slopes.

In view that the orientation and position of sensing tip 11 relative to the electron beam emitter 20 affects the slope of the curve such as seen in FIG. 3A, sensing tip 11 is calibrated for each particular orientation/position and high voltage level by correlating the signal S measured by measuring device 16 with actual electron beam 22 intensity readings taken with a dosemeter. Any change in the position or orientation of the sensing tip 11 requires recalibration. Such changes can occur during maintenance. In addition, replacement of the sensing tip 11 and electron beam emitter 20 with ones having differences from the originals usually requires recalibration. If the new sensing tip 11 and the electron beam emitter 20 are identical to the originals, recalibration may be unnecessary if the sensing tip 11 and electron beam emitter 20 are mounted in the identical orientation and position of the originals.

Figure 4:
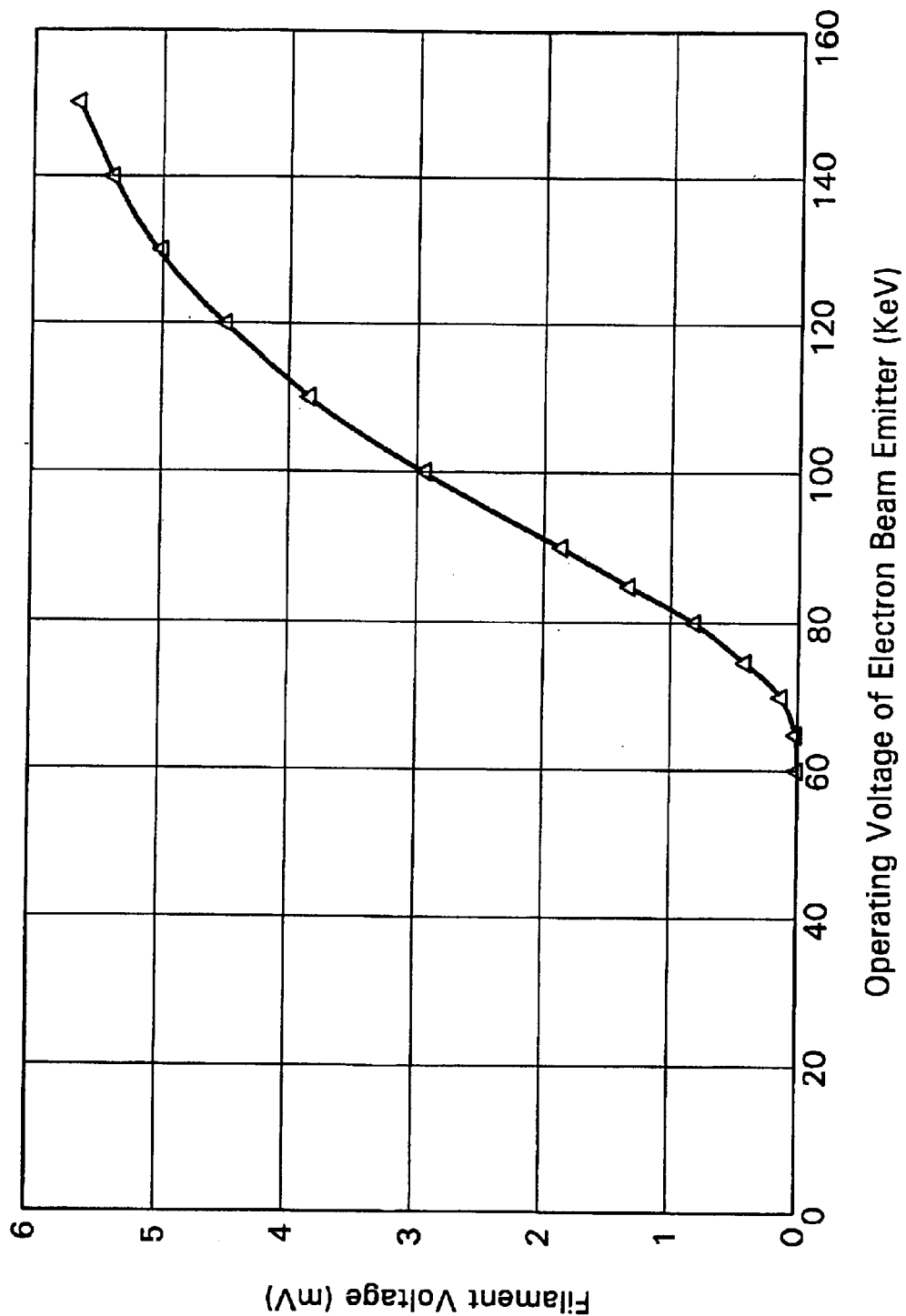
FIG. 4 is a graph depicting an example of the relationship between the electron beam signal voltage and the operating high voltage of an electron beam emitter.

Although FIG. 3A depicts a generally linear relationship between the intensity of electron beam 22 and the measured signal levels S at a given electron beam potential, the relationship between the operating high voltage potential of electron beam emitter 20 and the voltage through electron $e^{31}$ generating filament of electron beam emitter 20 can be non-linear for a given constant beam intensity, as depicted in the graph of FIG. 4. Due to this non-linearity, one can produce this curve for a given beam intensity level and compare it to stored data or compare the point ratio to detect high voltage level.

Figure 5:
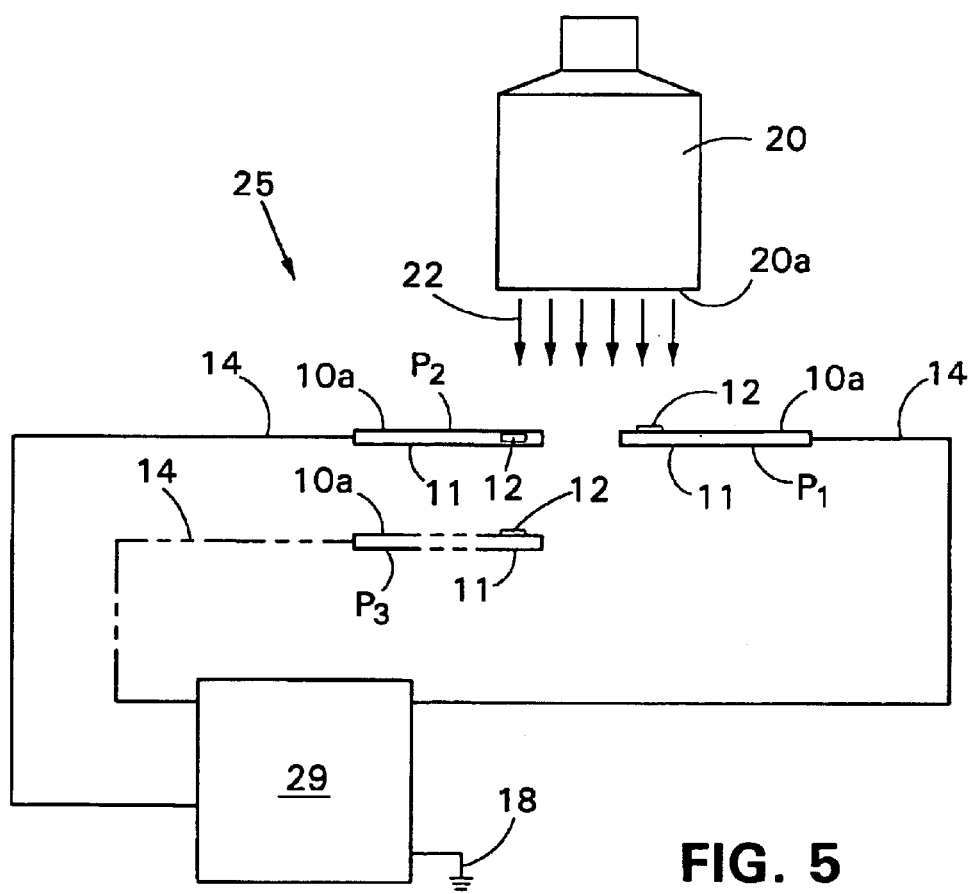
FIG. 5 is a schematic drawing depicting another embodiment of a sensing device having more than one sensing tip being in different positions and orientations relative to the measured electron beam.

Referring to FIG. 5, sensing device 25 is another embodiment of a sensing device in the present invention which includes two sensing members or tips 11 (FIG. 2) positioned under the electron beam 22 of an electron beam emitter 20 at two different positions/orientations, for example, $P_1$ and $P_2$. An alternate position $P_3$ is shown in phantom and discussed later. The sensing tip 11 at position $P_1$ has the entrance window 12 facing the exit window 20a of electron beam emitter 20 and the sensing tip 11 at position $P_2$ has the entrance window 12 facing at an angle relative to the exit window 20a, for example, perpendicular. The cables 14 of each sensing tip 11 are electrically connected to a measuring device 29 which measures electrical effects or signals S traveling from the sensing tips 11, for example, either voltage or current. FIG. 3A depicts an example of possible slopes of the measured electrical signal level versus electron beam intensity curves for positions $P_1$ and $P_2$ which differ from each other because the sensing tips 11 at positions $P_1$ and $P_2$ are arranged in a manner to provide differing conditions or electron $e^-$ reception capabilities. The electron beam 22 intensity can be measured by measuring device 29 from the signals $S_1$ or $S_2$ received from one or both sensing tips 11 in the manner previously described above. In addition, sensing tips 11 at positions $P_1$ and $P_2$ allow the uniformity of electron beam 22 to be measured from or across opposite sides.

In addition, measuring device 29 can determine the actual operating high voltage potential of electron beam emitter 20 that accelerates the electrons $e^-$ with the ratio $S_1/S_2$ between two measured signals $S_1$ and $S_2$ from the sensing tips 11 at positions $P_1$ and $P_2$ for a given electron beam 22 intensity. Before active measuring is possible, a library data base is formed. First, a series of signal levels $S_1$ and $S_2$ from positions $P_1$ and $P_2$ are previously determined for a desired range of a number of particular electron beam 22 intensities and operating high voltage potentials, resulting in a series of measured electrical signal level versus electron beam intensity curves which are stored and can consist of equations or data. Ratios $S_1/S_2$ can then be calculated and stored from the stored curve data for positions $P_1$ and $P_2$ for a number of corresponding operating high voltage potentials and electron beam 22 intensities in the desired range. Alternatively, the previously determined curves can be stored and the ratios $S_1/S_2$ for various high voltage potentials being calculated when needed. In either case, each ratio corresponds or is assigned to a particular high voltage potential value.

Once the library data base is formed with the stored data, active measuring of the high voltage values can take place. During active measuring, first, signal levels $S_1$ and $S_2$ from positions $P_1$ and $P_2$ are actively measured. Measuring device 29 then calculates the ratio $S_1/S_2$ between the actively measured signal levels $S_1$ and $S_2$. The actively measured ratio $S_1/S_2$ is then compared with the stored data ratios $S_1/S_2$ from the library data base until a ratio match is made. The stored data ratios $S_1/S_2$ can be stored as ratios or can be calculated from the stored curves or data. In both situations, the stored data ratios $S_1/S_2$ originate from data stored in the library. Since each stored data ratio $S_1/S_2$ has an assigned high voltage potential value, the measured operating high voltage potential of electron beam emitter 20 is the voltage level that is assigned to the matching stored data ratio $S_1/S_2$. Alternatively, the actively measured ratio $S_1/S_2$ can be manually matched with a voltage level on a chart or graph. If the measured electron beam 22 intensity or high voltage level does not match the input settings for the operation of electron beam emitter 20, the measuring device 29 can sound an alarm and/or shut down the operation of electron beam emitter 20 or operate a feedback or control circuit.

Although the sensing tips 11 at positions $P_1$ and $P_2$ are shown in FIG. 5 to be positioned the same distance away from exit window 20a with the entrance windows 12 oriented differently relative to electron beam 22, alternatively, one of the positions $P_1$ or $P_2$ can be substituted with a sensing tip 11 at other suitable positions such as position $P_3$ (shown in phantom). Consequently, the corresponding signal level ratios employed for measuring the actual operating high voltage potential of electron beam emitter 20 can be $S_1/S_3$ or $S_2/S_3$. The entrance window 12 at position $P_3$ can face the exit window 20a of electron beam emitter 20, as shown, or can be oriented at an angle thereof. In addition, the thicknesses of the entrance windows 12 of the sensing tips 11 at positions $P_1$, $P_2$ or $P_3$ can differ in order to provide the desired measured signal level versus electron beam intensity curves. Even if two sensing tips 11 are positioned the same distance away from exit window 20a with entrance window 12 being oriented in the same manner, different thickness entrance windows 12 can be employed to form differing conditions or arrangements. The differing conditions or arrangements provide two different linear sloped measured signal level versus electron beam intensity curves which allows the actual high voltage potential of electron beam emitter 20 to be determined by the comparison of actively measured signal level ratios with stored data ratios. Finally, although the sensing tips 11 of sensing device 25 are shown to be connected to a single measuring device 29, alternatively, the sensing tips 11 can be connected to the individual measuring devices 16 as shown in FIG. 1. These individual measuring devices 16, in some cases, can then be connected to measuring device 29.

In situations where only one sensing tip 11 is employed such as in FIG. 1, the operating high voltage level of electron beam emitter 20 can still be measured by ramping up either one of the high voltage potential or the electron beam intensity while the other is kept constant, and taking periodic measurements. The result is the formation of a non-linear curve or data, which is compared with curves or data previously stored in a library data base. Each stored curve has an assigned corresponding voltage level value. The actual operating high voltage level of the electron beam emitter 20 can be found by matching the newly measured curve with the stored curve where the measured high voltage level is the voltage level that is assigned to the matching stored curve.

Figure 6:
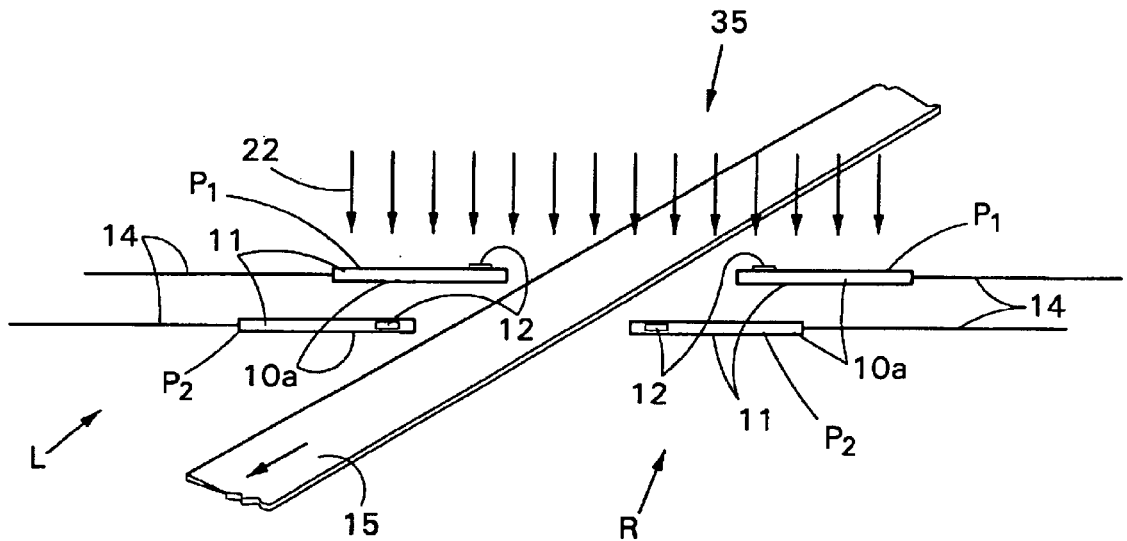
FIG. 6 is a schematic drawing of yet another embodiment of a sensing device having a pair of sensing tips at opposite ends of an electron beam with different positions/orientations for monitoring the intensity at the ends.

Referring to FIG. 6, sensing device 35 is yet another embodiment of a sensing device in the present invention which includes a pair of sensing members or tips 11 (FIG. 2) positioned under the electron beam 22 of an electron beam emitter 20 at opposite sides or ends R and L of the electron beam 22. In the example shown, the electron beam 22 is irradiating a moving article 15. Each pair of sensing tips 11 is shown positioned in different orientations or positions $P_1$ and $P_2$, with the entrance window 12 of the sensing tip 11 at position $P_1$ facing the electron beam 22 and the entrance window 12 of the sensing tip 11 at orientation/position $P_2$ being positioned at an angle thereof, for example, sideways or perpendicular relative to electron beam 22. The sensing tips 11 are electrically connected to a measuring device 29 (FIG. 5) by cables 14. The sensing tips 11 allow the electron beam 22 intensity to be measured at or across the opposite sides R and L of the electron beam 22 in a manner similar to that discussed above to monitor uniformity. In addition, since the sensing tips 11 in each pair are spaced apart from each other, the electron beam 22 intensity at each side R and L can be measured across the width of the electron beam 22. Furthermore, the operating high voltage level can also be measured at or across the opposite ends R and L in the regions occupied by the sensing tips 11 in a manner similar to that discussed above. A feedback loop, control circuit, shutoff, and/or alarm can be employed if any of the measured values are not at the proper levels. Although the sensing tips 11 are shown in positions $P_1$ and $P_2$, some of the sensing tips 11 can also be in position $P_3$ (FIG. 5), or other suitable positions/orientations. The sensing tips 11 can also have entrance windows 12 of different thicknesses or sizes.

Figure 7:
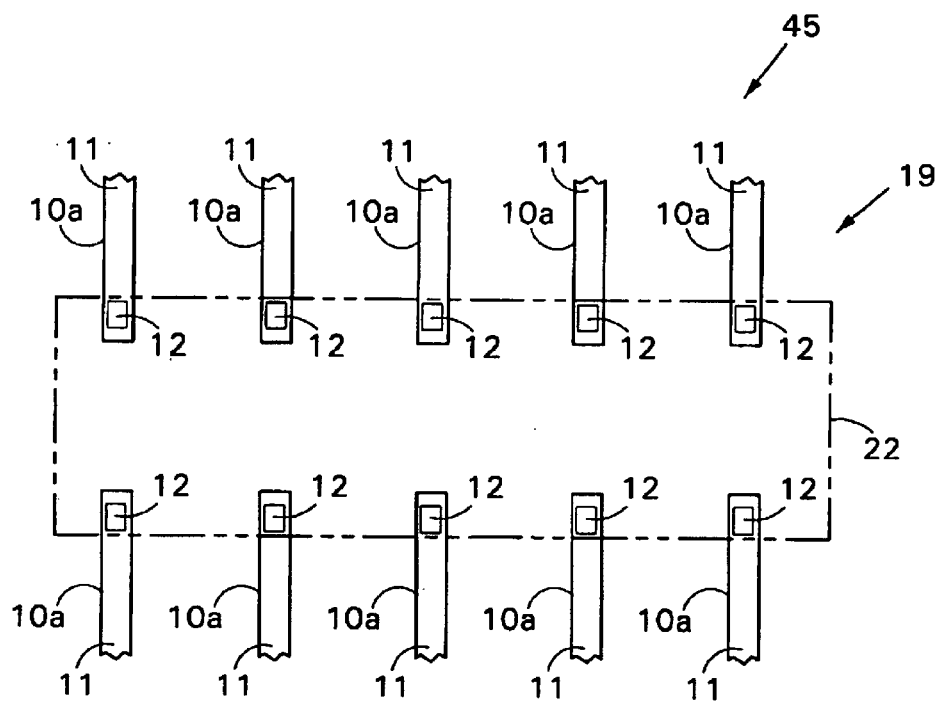
FIG. 7 is a schematic plan view of still another embodiment of a sensing device having an array of sensing tips positioned within an electron beam for monitoring intensity across the electron beam.

Referring to FIG. 7, sensing device 45 is still another embodiment of a sensing device in the present invention which includes an array of sensing members or tips 11 (FIG. 2) which are positioned within the electron beam 22 of an electron beam emitter 20. The sensing tips 11 are connected to a measuring device 29 via cables 14 (FIG. 5). The array 19 of sensing tips 11 allows the electron beam 22 intensity to be measured at various multiple locations occupied by the sensing tips 11 along the length and across the width of the electron beam 22 to measure uniformity. In addition, by orienting or positioning some of the sensing tips 11 at different orientations/positions, for example, positions $P_1$, $P_2$ or $P_3$ (FIG. 5) or employing different thickness entrance windows 12, the operating high voltage at various multiple locations along the length and width of the electron beam 22 can be measured. If the sensing tips 11 are located in the electron beam 22 pathway between the exit window 20a of the electron beam emitter 20 and the object being irradiated, for example, a moving article 15 (FIG. 6), the sensing tips 11 are preferably positioned far enough away from the moving article 15 so that the electron beam 22 has sufficient distance to at least substantially recombine on the other side of the sensing tips 11. Consequently, by the time the electron beam 22 reaches the moving article 15, the electron beam 22 can be considered continuous.

Figure 8:
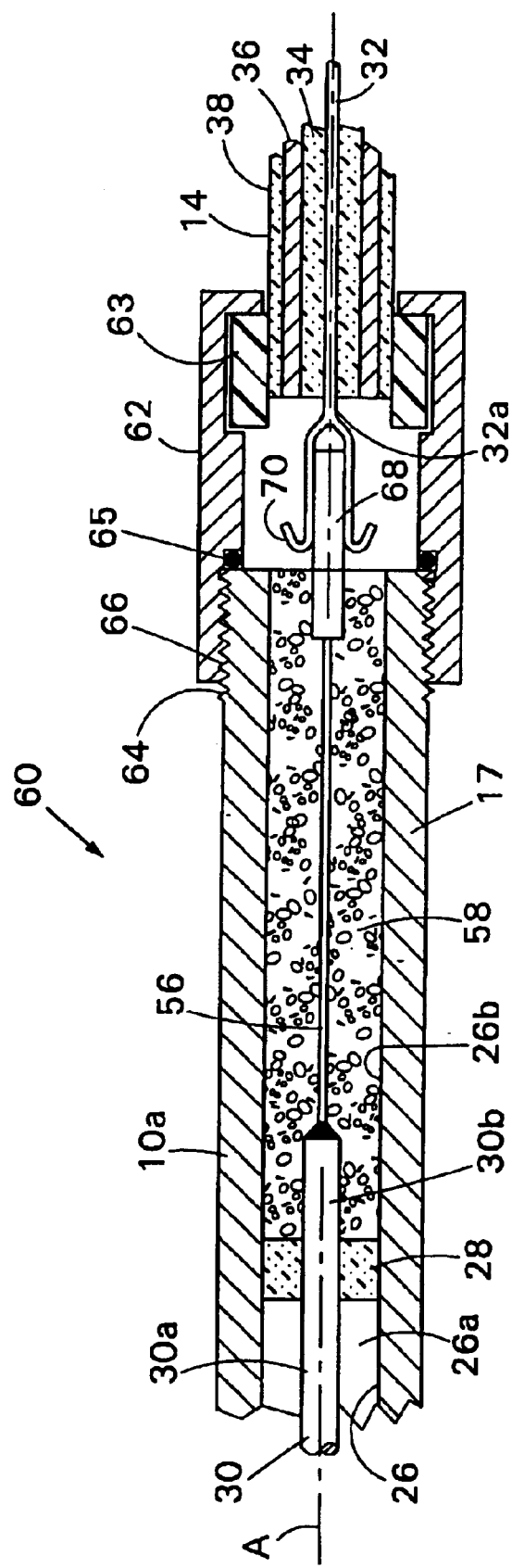
FIG. 8 is a side-sectional view of the proximal portion of another embodiment of a sensing tip in the present invention.

Referring to FIG. 8, sensing tip 60 is another embodiment of a sensing tip in the present invention that includes an electrical connector 68 extending from the proximal end of sensing device body 10a which is electrically connected to the proximal portion 30b of electrode 30 by a conductor 56 secured therebetween. An insulating material 58 can be employed to secure the electrical connector 68/conductor 56 assembly within the proximal portion 26b of cavity 26. A connector 70 secured to the distal end 32a of the central conductor 32 of cable 14 engages connector 68 for electrical connection therebetween. Cable 14 includes a threaded nut 62 having an internal thread 66 for engaging an external thread 64 on the exterior of sensing device body 10a for securing cable 14 to sensing device body 10a. In an alternative embodiment, the distal end 32a of central conductor 32 of cable 14 can be inserted into a female connector. If desired, an insulative sealing member or O-ring 63 can be included that provides a seal against the cable 14 as it is squeezed as the nut 62 is tightened. In addition, an O-ring 65 can provide sealing between nut 62 and sensing device body 10a.

Figure 9:
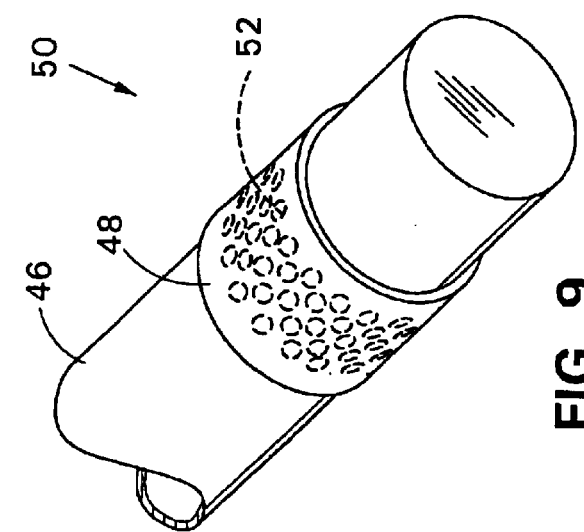
FIG. 9 is a perspective view of the distal portion of yet another embodiment of a sensing tip.

Referring to FIG. 9, sensing tip 50 is an embodiment of yet another sensing tip in the present invention in which the sensing device body 46 is circular in cross section instead of square. Entrance window 48 can be joined or sealed to either a short perimeter arc or most of the perimeter of sensing device body 46. When entrance window 48 extends over a short perimeter arc, a single opening 52 into the vacuum chamber can be employed. When entrance window 48 extends over most or all of the perimeter, multiple openings 52 into the vacuum chamber can be employed. When the entrance window 48 extends about most of the perimeter of sensing device body 46, sensing tip 50 has a configuration that is suitable for receiving electrons e⁻ from radially inwardly directed electron beams 22 generated by a ring of electron beam emitters 20.

Figure 10:
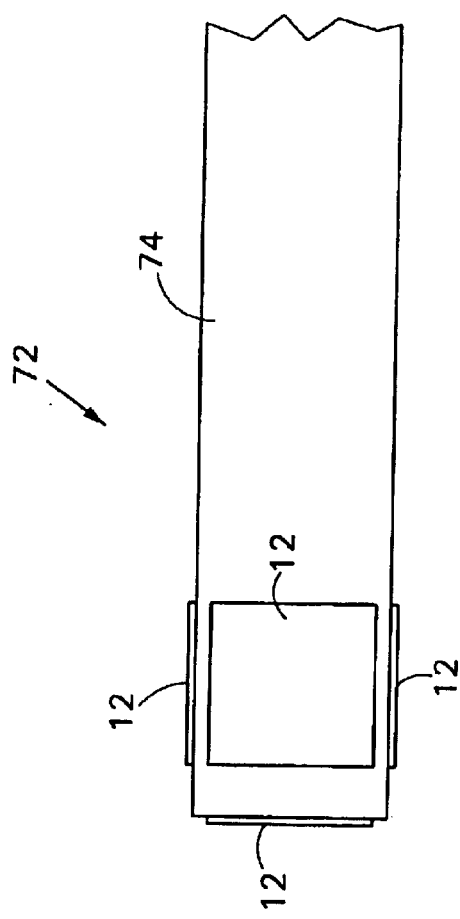
FIG. 10 is a side view of the distal portion of still another embodiment of a sensing tip.

Referring to FIG. 10, sensing tip 72 is an embodiment of still another sensing tip in the present invention which includes entrance windows 12 joined or sealed on five sides of the sensing device body 74, top, bottom, sides and end, for receiving electrons e⁻ from electron beams 22 coming from almost all directions except from the proximal end of sensing device body 74, typically, four directions being common.

Figure 11:
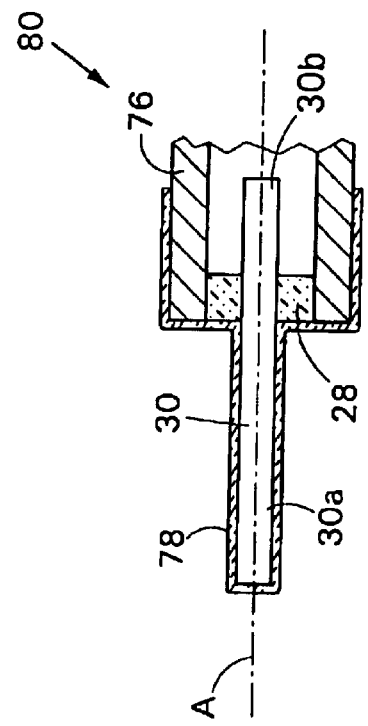
FIG. 11 is a side sectional view of the distal portion of another embodiment of a sensing tip.

Referring to FIG. 11, sensing tip 80 is an embodiment of still another sensing tip in the present invention. Sensing tip 80 includes a sensing device body 76 which does not have a vacuum chamber. Instead, electrode 30 extends from sensing device body 76 through insulator 28 and has an insulating layer 78 covering the distal portion 30a of electrode 30. The insulating layer 78 can extend over a portion of sensing device body 76. The insulating layer 78 substantially isolates plasma and associated electrical field effects generated by electron beam 22 that are external to the sensing tip 80 from the electrode 30 as well as allows the passage of electrons e⁻ from electron beam 22 therethrough. As a result, the insulating layer 78 reduces or prevents such secondary external electrical effects from electrically affecting electrode 30 while at the same time allowing electrons e⁻ to pass through and reach electrode 30. Therefore, the insulating layer 78 acts as both an insulator and an entrance window. In one embodiment, the insulating layer 78 is a layer of ceramic between about 2–6 microns thick that is formed by vapor deposition. The insulating layer can be made of a material such as silicon oxide, aluminum oxide, etc. The proximal portion of 30b of electrode 30 is typically connected to cable 14 in a manner similar to that shown in FIGS. 2 and 8. Sensing tip 80 can be used in any of the manners previously discussed.

Although the sensing members or tips which include vacuum chambers have been shown in the figures to have thin, elongate vacuum chambers and cylindrical electrodes, alternatively, the vacuum chambers can have other suitable shapes, for example, tall, wide, flat, bulbous, etc. When a vacuum chamber is wide, the electrode can be made flat and contoured to fit within or extend across substantially the area of the vacuum chamber that is transverse to the entrance window. The sensing tips can have rectangular, oval, or polygonal cross sections, or combinations thereof. With varying shapes and sizes of vacuum chambers, it is understood that the size of the electron permeable entrance windows can vary, depending upon the application. In addition, although cable 14 has been shown to be a coaxial cable, non-coaxial cables can be employed. Furthermore, although measuring devices 16 and 29 have been described to measure either voltage or current, alternatively, measuring devices 16 and 29 can also be constructed to measure power. Finally, although the present invention has been described primarily for measuring electron beam intensities or high voltage potentials in a gaseous environment, alternatively, measurements can be made in fully or partially evacuated environments.

While this invention has been particularly shown and described with references to preferred embodiments thereof, it will be understood by those skilled in the art that various changes in form and details may be made therein without departing from the scope of the invention encompassed by the appended claims.

For example, components of the different embodiments of the present invention can be omitted or combined together. In addition, although some dimensions have been provided for some components, it is understood that such dimensions can vary depending upon the application at hand. Furthermore, the electron beam emitters and the sensing members or tips can be positioned in a variety of different orientations other than that shown in the figures. The sensing tips can in some cases be oriented so that the entrance windows are facing at any angle relative to the electron beam exit windows of the electron beam emitters. It is also understood that the voltage, current and power ranges measured by the measuring devices 16 and 29 will vary depending upon the voltage at which the electron beam emitters 20 are operated. The operating range of electron beam emitter 20 is typically 50–300 kV with measuring device 16 often measuring in the range of a few nano amps. Depending upon the application at hand, such ranges can be higher or lower, and different thicknesses of the window can be made for different operating voltages. For example, a 0.2 mil membrane of titanium or a 2 to 3 micron membrane of silicon can be employed for sensing an electron beam under 50 kV. Similarly, a thicker membrane, for example, 12 micron titanium, can be suitable for higher operating voltages such as 300 kV to 500 kV, or higher.

What is claimed is:

1. A sensing device for sensing an electron beam comprising:
    a vacuum chamber having an electron permeable window for allowing electrons from the electron beam to enter the vacuum chamber; and
    an electrode extending within the vacuum chamber for receiving at least a portion of the electrons entering the vacuum chamber, the intensity of the electron beam capable of being determined from the amount of electrons received by the electrode.

2. The sensing device of claim 1 further comprising a measuring device electrically connected to the electrode for measuring effects of the electron beam on the electrode.

3. The sensing device of claim 2 in which the measuring device is connected to the electrode by a cable.

4. The sensing device of claim 3 in which the measuring device measures at least one of voltage and current.

5. The sensing device of claim 1 in which the electrode extends along an axis within the vacuum chamber with the electron permeable window being parallel to the axis of the electrode.

6. The sensing device of claim 5 in which the electrode extends from the vacuum chamber through an insulator for electrical connection to a cable.

7. A sensing device for sensing an electron beam comprising:
    a vacuum chamber having an electron permeable window for allowing electrons from the electron beam to enter the vacuum chamber;
    an electrode extending within the vacuum chamber for receiving electrons entering the vacuum chamber, the electron permeable window being parallel to the axis of the electrode; and
    a measuring device electrically connected to the electrode for measuring effects of the electron beam on the electrode, the intensity of the electron beam capable of being determined from the amount of electrons received by the electrode.

8. The sensing device of claim 7 in which the measuring device is connected to the electrode by a cable.

9. The sensing device of claim 8 in which the measuring device measures at least one of voltage and current.

10. The sensing device of claim 7 in which the electrode extends from the vacuum chamber through an insulator for electrical connection to a cable.

11. A sensing device for sensing an electron beam accelerated by a voltage potential comprising:
    a first sensing member for receiving electrons from the electron beam;
    a second sensing member for receiving electrons from the electron beam, the second sensing member being arranged for receiving less electrons than the first sensing member, in which the sensing members each comprise a vacuum chamber having an electron permeable window for allowing electrons from the electron beam to enter the vacuum chamber, and an electrode extending within the vacuum chamber for receiving at least a portion of the electrons entering the vacuum chamber, the intensity of the electron beam capable of being determined from the amount of electrons received by the electrode of at least one of the sensing members; and a measuring device electrically connected to the first and second sensing members for measuring effects of the electron beam on the first and second sensing members, the measuring device capable of correlating the measured effects of the first and second sensing members into at least one of electron beam intensity and the voltage potential at which the electrons are accelerated.

12. The sensing device of claim 11 in which the measuring device is electrically connected to each electrode of the sensing members with a respective cable.

13. The sensing device of claim 12 in which the measuring device measures at least one of voltage and current from the first and second sensing members.

14. The sensing device of claim 13 in which the voltage potential at which the electrons are accelerated can be determined from a ratio between the measured effects of the first and second sensing members.

15. The sensing device of claim 14 in which said ratio is matched with a matching stored data ratio originating from a library of stored data, the matching stored data ratio having an assigned voltage value corresponding to said voltage potential at which the electrons are accelerated.

16. The sensing device of claim 11 further comprising:
third and fourth sensing members for receiving electrons from the electron beam, the fourth sensing member being arranged for receiving less electrons than the third sensing member, the measuring device being electrically connected to the third and fourth sensing members for measuring effects of the electron beam on the third and fourth sensing members and correlating the measured effects of the third and fourth sensing members into at least one of electron beam intensity and the voltage potential at which the electrons are accelerated.

17. A sensing device for sensing an electron beam comprising:
an array of sensing members each comprising a vacuum chamber having an electron permeable window for allowing electrons from the electron beam to enter the vacuum chamber, and an electrode extending within the vacuum chamber for receiving at least a portion of the electrons entering the vacuum chamber, the intensity of the electron beam at a particular location capable of being determined from the amount of electrons received by the electrode of the sensing member at said particular location.

18. A sensing device for sensing an electron beam comprising:
a generally cylindrical electrode for receiving electrons from the electron beam, the intensity of the electron beam capable of being determined from the amount of electrons received by the electrode; and
an insulating layer covering the electrode for isolating the electrode from secondary electrical effects while at the same time allowing electrons from the electron beam to pass therethrough to the electrode.

19. A method of forming a sensing device for sensing an electron beam comprising:
forming a vacuum chamber having an electron permeable window for allowing electrons from the electron beam to enter the vacuum chamber; and extending an electrode within the vacuum chamber for receiving at least a portion of the electrons entering the vacuum chamber, the intensity of the electron beam capable of being determined from the amount of electrons received by the electrode.

20. The method of claim 19 further comprising electrically connecting a measuring device to the electrode for measuring effects of the electron beam on the electrode.

21. The method of claim 20 further comprising electrically connecting the measuring device to the electrode with a cable.

22. The method of claim 21 further comprising forming the measuring device to measure at least one of voltage and current.

23. The method of claim 19 further comprising extending the electrode along an axis within the vacuum chamber with the electron permeable window being parallel to the axis of the electrode.

24. The method of claim 23 further comprising extending the electrode from the vacuum chamber through an insulator for electrical connection to a cable.

25. A method of forming an sensing device for sensing an electron beam accelerated by a voltage potential comprising:
providing a first sensing member for receiving electrons from the electron beam;
providing a second sensing member for receiving electrons from the electron beam, the second sensing member being arranged for receiving less electrons than the first sensing member, in which the sensing members each comprise a vacuum chamber having an electron permeable window for allowing electrons from the electron beam to enter the vacuum chamber, and an electrode extending within the vacuum chamber for receiving at least a portion of the electrons entering the vacuum chamber, the intensity of the electron beam capable of being determined from the amount of electrons received by the electrode of at least one of the sensing members; and
electrically connecting a measuring device to the first and second sensing members for measuring effects of the electron beam on the first and second sensing members, the measuring device capable of correlating the measured effects of the first and second sensing members into at least one of electron beam intensity and the voltage potential at which the electrons are accelerated.

26. The method of claim 25 further comprising electrically connecting the measuring device to each electrode of the sensing members with a respective cable.

27. The method of claim 26 further comprising forming the measuring device to measure at least one of voltage and current from the first and second sensing members.

28. The method of 27 further comprising forming the measuring device to determine the voltage potential at which the electrons are accelerated from a ratio between the measured effects of the first and second sensing members.

29. The method of claim 28 further comprising matching said ratio with a matching stored data ratio originating from a library of stored data, the matching stored data ratio having an assigned voltage value corresponding to said voltage potential at which the electrons are accelerated.

30. The method of claim 25 further comprising:
providing third and fourth sensing members for receiving electrons from the electron beam, the fourth sensing member being arranged for receiving less electrons than the third sensing member, the measuring device being electrically connected to the third and fourth sensing members for measuring effects of the electron beam on the third and fourth sensing members and correlating the measured effects of the third and fourth sensing members into at least one of electron beam intensity and the voltage potential at which the electrons are accelerated.

31. A method of forming a sensing device for sensing an electron beam comprising:

forming an array of sensing members each comprising a vacuum chamber having an electron permeable window for allowing electrons from the electron beam to enter the vacuum chamber, and an electrode extending within the vacuum chamber for receiving at least a portion of the electrons entering the vacuum chamber, the intensity of the electron beam at a particular location capable of being determined from the amount of electrons received by the electrode of the sensing member at said particular location.

32. A method of forming a sensing device for sensing an electron beam comprising:

providing a generally cylindrical electrode for receiving electrons from the electron beam, the intensity of the electron beam capable of being determined from the amount of electrons received by the electrode; and covering the electrode with an insulating layer for isolating the electrode from secondary electrical effects while at the same time allowing electrons from the electron beam to pass therethrough to the electrode.

33. A method of sensing an electron beam comprising:

positioning a vacuum chamber of a sensing device within the electron beam, the vacuum chamber having an electron permeable window for allowing electrons from the electron beam to enter the vacuum chamber;

receiving at least a portion of the electrons entering the vacuum chamber with an electrode extending within the vacuum chamber; and determining the intensity of the electron beam from the amount of electrons received by the electrode.

34. The method of claim 33 further comprising measuring effects of the electron beam on the electrode with a measuring device electrically connected to the electrode.

35. The method of claim 34 further comprising measuring at least one of voltage and current with the measuring device.

36. The method of claim 33 further comprising extending the electrode along an axis within the vacuum chamber with the electron permeable window being parallel to the axis of the electrode.

37. The method of claim 36 further extending the electrode from the vacuum chamber through an insulator for electrical connection to a cable.

38. A method of sensing an electron beam accelerated by a voltage potential comprising:

positioning a first sensing member within the electron beam for receiving electrons from the electron beam;

positioning a second sensing member within the electron beam for receiving electrons from the electron beam, the second sensing member being arranged for receiving less electrons than the first sensing member, in which each sensing member comprises a vacuum chamber having an electron permeable window for allowing electrons from the electron beam to enter the vacuum chamber, and an electrode extending within the vacuum chamber for receiving at least a portion of the electrons entering the vacuum chamber; and measuring effects of the electron beam on the first and second sensing members with a measuring device electrically connected to the first and second sensing members, the measuring device correlating the measured effects of the first and second sensing members into at least one of electron beam intensity and the voltage potential at which the electrons are accelerated.

39. The method of claim 38 further comprising determining the intensity of the electron beam from the amount of electrons received by the electrode of at least one of the sensing members.

40. The method of claim 39 further comprising measuring at least one of voltage and current from the first and second sensing members.

41. The method of claim 40 further comprising determining the voltage potential at which the electrons are accelerated from a ratio between the measured effects of the first and second sensing members.

42. The method of claim 41 comprising matching said ratio with a matching stored data ratio originating from a library of stored data, the matching stored data ratio having an assigned voltage value corresponding to said voltage potential at which the electrons are accelerated.

43. The method of claim 38 further comprising:

positioning third and fourth sensing members within the electron beam for receiving electrons from the electron beam, the fourth sensing member being arranged for receiving less electrons than the third sensing member; and measuring effects of the electron beam on the third and fourth sensing members with the measuring device and correlating the measured effects of the first and second sensing members into at least one of electron beam intensity and the voltage potential at which the electrons are accelerated.

44. A method of sensing an electron beam comprising:

positioning an array of sensing members within the electron beam, each sensing member comprising a vacuum chamber having an electron permeable window for allowing electrons from the electron beam to enter the vacuum chamber, and an electrode extending within the vacuum chamber for receiving at least a portion of the electrons entering the vacuum chamber; and determining the intensity of the electron beam at a particular location from the amount of electrons received by the electrode of the sensing member at said particular location.

45. A method of sensing an electron beam comprising:

positioning a generally cylindrical electrode within the electron beam for receiving electrons from the electron beam;

isolating the electrode from secondary electrical effects with an insulating layer covering the electrode which at the same time allows electrons from the electron beam to pass therethrough to the electrode; and determining the intensity of the electron beam from the amount of electrons received by the electrode.

* * * * *

UNITED STATES PATENT AND TRADEMARK OFFICE
CERTIFICATE OF CORRECTION

PATENT NO. : 6,919,570 B2
DATED : July 19, 2005
INVENTOR(S) : Tzvi Avnery

It is certified that error appears in the above-identified patent and that said Letters Patent is hereby corrected as shown below:

Column 15,
Line 49, insert -- comprising -- between "further" and "extending".

Signed and Sealed this

Twenty-first Day of March, 2006

JON W. DUDAS
*Director of the United States Patent and Trademark Office*